United States Patent
Louh

(10) Patent No.: US 7,988,899 B2
(45) Date of Patent: Aug. 2, 2011

(54) STAMPER AND METHOD FOR MAKING SOFT MOLD

(75) Inventor: Sei-Ping Louh, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 190 days.

(21) Appl. No.: 12/492,153

(22) Filed: Jun. 26, 2009

(65) Prior Publication Data

US 2010/0136154 A1 Jun. 3, 2010

(30) Foreign Application Priority Data

Dec. 1, 2008 (CN) .......................... 2008 10 305893

(51) Int. Cl.
*B29C 57/00* (2006.01)
(52) U.S. Cl. ......... 264/296; 264/293; 264/294; 264/2.5; 264/225; 425/385
(58) Field of Classification Search .................. 264/296, 264/2.5, 293, 294; 425/385
See application file for complete search history.

(56) References Cited

U.S. PATENT DOCUMENTS

| 6,623,803 B1 * | 9/2003 | Krivokapic .................. 427/304 |
| 7,575,700 B2 * | 8/2009 | Ishler .............................. 264/71 |
| 2007/0200276 A1 * | 8/2007 | Mackey et al. ............... 264/293 |

* cited by examiner

*Primary Examiner* — Joseph S Del Sole
*Assistant Examiner* — David N Brown, II
(74) *Attorney, Agent, or Firm* — Raymond J. Chew

(57) ABSTRACT

An exemplary method for making a soft mold is provided. A transparent substrate is provided. A to-be-solidified film is formed on the transparent substrate. A stamper and a guiding plate are further provided. The guiding plate is positioned between the stamper and the to-be-solidified film. The stamper inserts one of the through holes of the guiding plate. The first alignment mark is aligned with one of the second alignment marks. The stamper is pressed into the to-be-solidified film. The pressed portion of the to-be-solidified film is solidified to obtain a second molding surface on the to-be-solidified film. The previous steps are repeated for the stamper and the rest of the through holes of the guiding plate to obtain a soft mold having a plurality of the second molding surfaces.

8 Claims, 9 Drawing Sheets

STAMPER AND METHOD FOR MAKING SOFT MOLD

BACKGROUND

1. Technical Field

The present disclosure relates to a stamper and a method for making a soft mold.

2. Description of Related Art

Imprint technology is a simple process with low cost, high throughput and high resolution. Imprint technology is widely used for making a soft mold used for making micro lens in wafer lens package (WLP).

In a typical imprint process for making a soft mold, a stamper having a molding pattern tends to tilt towards the molding surface of a soft mold, thus the molding pattern of the stamper can't be precisely transferred to the soft mold. So the dimension precision of the molding surface of the soft mold can be greatly decreased.

Therefore, a method for making a soft mold which can overcome the above mentioned problems is desired.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Various embodiments will now be described in detail below with reference to the drawings.

A method for making a soft mold 60 (see FIG. 9) will be described in detail as follows.

Figure 1:
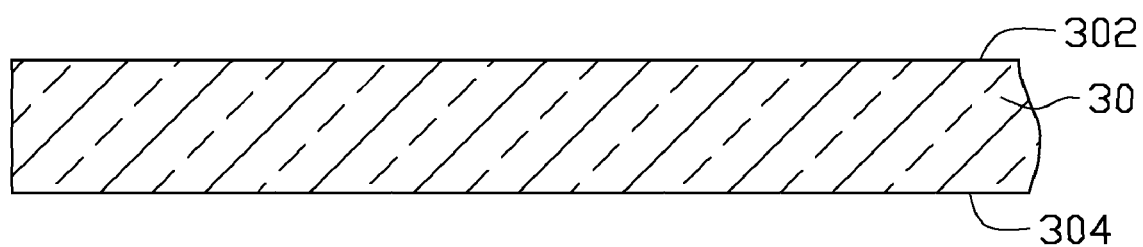
FIG. 1 is a schematic, cross-sectional view of a transparent substrate according to an exemplary embodiment of the present invention.

Referring to FIG. 1, a transparent substrate 30 is provided. In one embodiment, the transparent substrate 30 is made of glass. The transparent substrate 30 includes a first surface 302 and a second surface 304 at the opposite side thereof.

Figure 2:
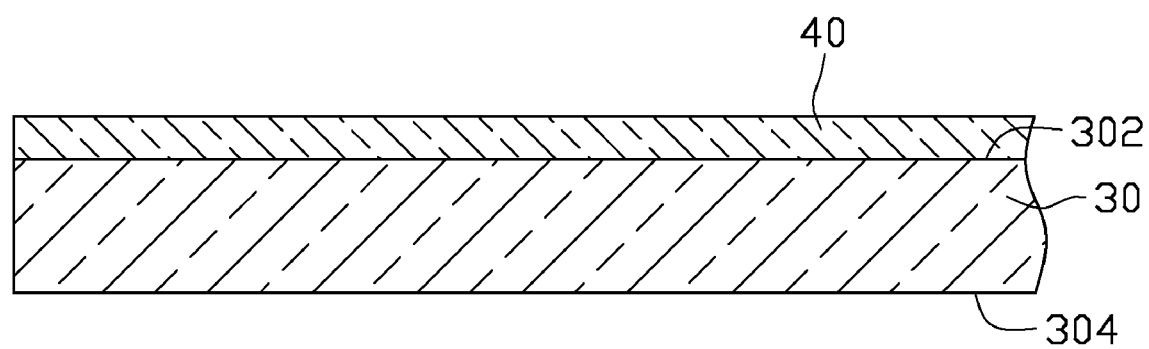
FIG. 2 is a schematic, cross-sectional view of the transparent substrate of FIG. 1 with a to-be-solidified film formed thereon.

Referring to FIG. 2, a to-be-solidified film 40 is formed on the first surface 302 of the transparent substrate 30. The to-be-solidified film 40 can be formed by a process including but not limited to a spin coating and a slit coating. In one embodiment, the to-be-solidified film 40 is made of light-curable material, for example, epoxy resin, acrylate-based resin, polyurethane, or polymerized siloxanes.

Figure 3:
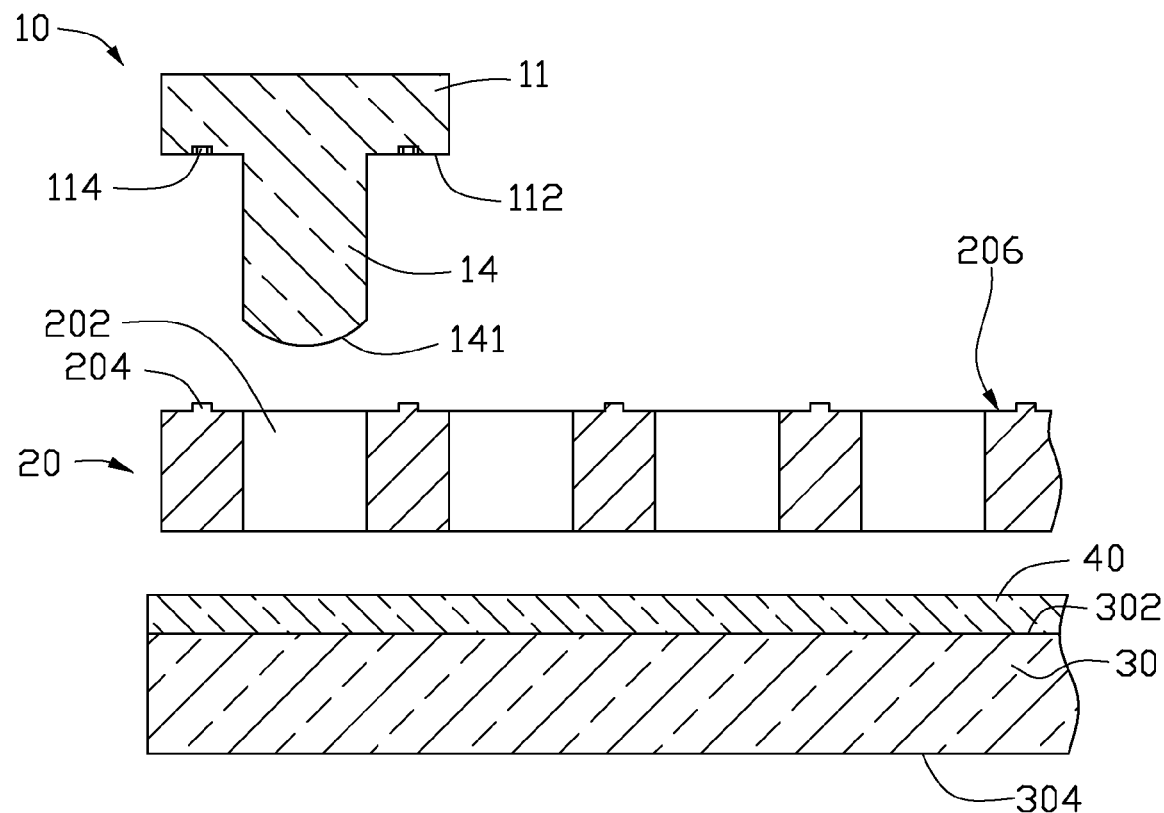
FIG. 3 shows a stamper and a guiding plate.
Figure 4:
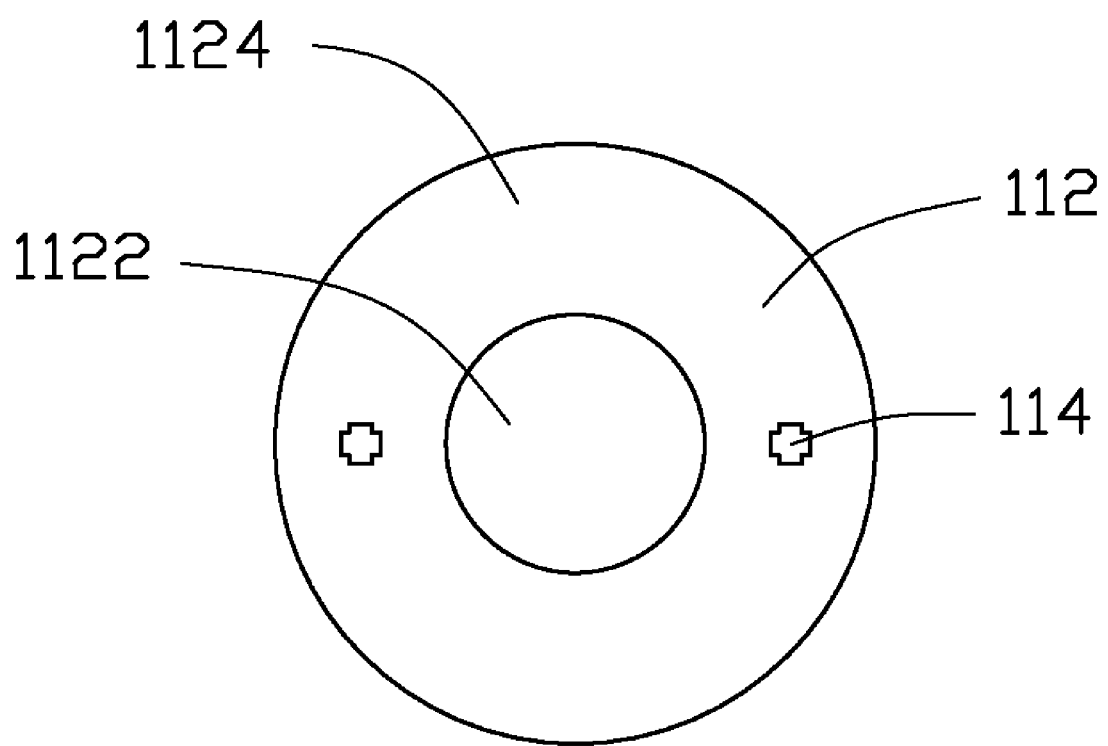
FIG. 4 is a schematic, plan view of the stamper of FIG. 3.
Figure 5:
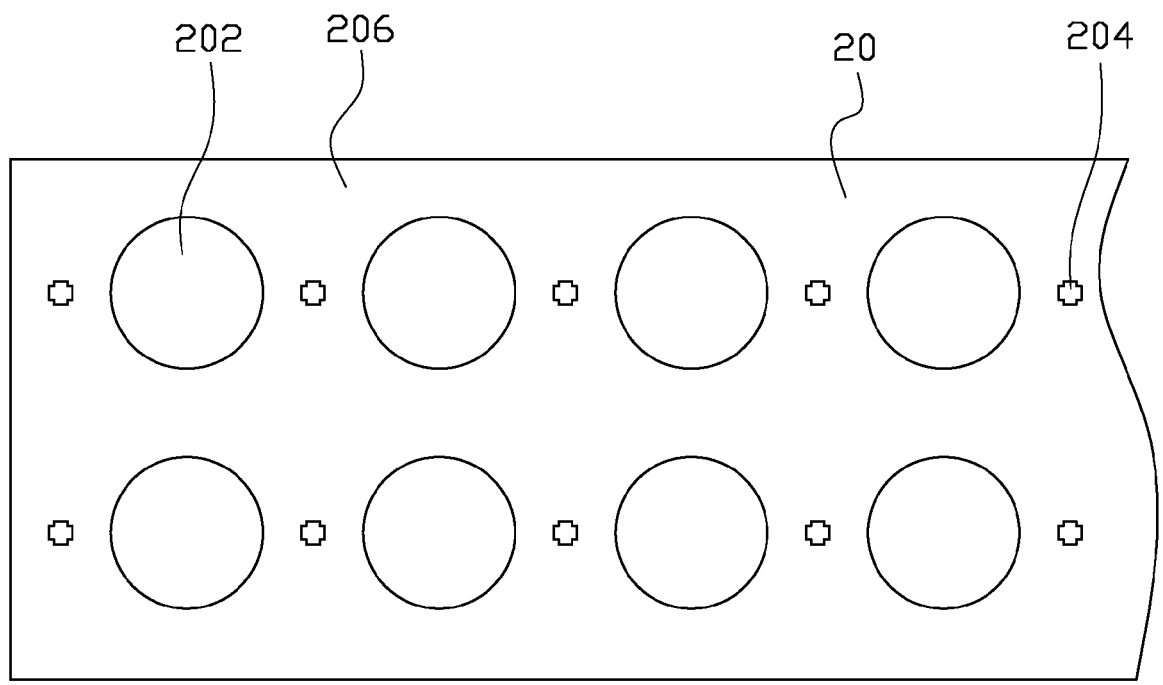
FIG. 5 is a schematic, plan view of the guiding plate of FIG. 3.

Referring to FIGS. 3-5, a stamper 10 and a guiding plate 20 are further provided. The stamper 10 includes a base 11 having a surface 112 and a molding portion 14 protruding from the surface 112. In one embodiment, the molding portion 14 is a cylinder. The molding portion 14 includes a first molding surface 141 at an opposite side thereof to the base 11. The first molding surface 141 can be concave or convex. In the present embodiment, the first molding surface 141 is convex. The surface 112 of the base 11 has a first region 1122 and a second region 1124. The first region 1122 is covered by the molding portion 14. The second region 1124 is exposed. Two first alignment marks 114 are formed on the second region 1124 of the surface 112. It can be understood that the number of the first alignment mark 114 is not limited to two, and it can be one, or more than two. In the present embodiment, each of the first alignment marks 114 is cross-shaped. It can be understood that the first alignment marks 114 can be any desired shape. Each of the two first alignment marks 114 is a protrusion extending from the surface 112 of the base 11. Alternatively, each of the two first alignment marks 114 can be a recess defined in the surface 112 of the base 11. In the present embodiment, each of the two first alignment marks 114 is a recess defined in the surface 112. The stamper 10 is made by an ultra-precision process.

The guiding plate 20 includes a plurality of through holes 202 defined therein and a plurality of second alignment marks 204 adjacent to the respective through holes 202. The diameter of each through hole 202 is approximately equal to the diameter of the molding portion 14 of the stamper 10. In the present embodiment, the two second alignment marks 204 are protrusions extending from a surface 206 of the guiding plate 20.

Figure 6:
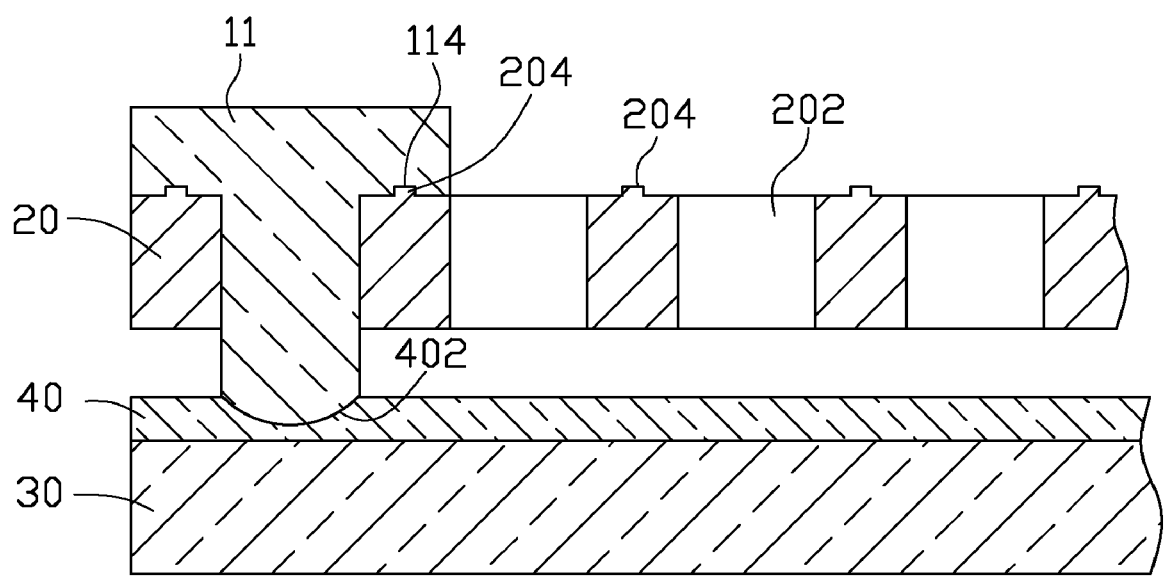
FIG. 6 shows that the guiding plate is positioned between the to-be-solidified film and the stamper, and the stamper presses into the to-be-solidified film.

Referring to FIG. 6, the guiding plate 20 is positioned between the to-be-solidified film 40 and the stamper 10. Next, the molding portion 14 of the stamper 10 inserts one through hole 202 and aligning the two first alignment marks 114 with two second alignment marks 204, and then the stamper 10 presses into the to-be-solidified film 40.

Figure 7:
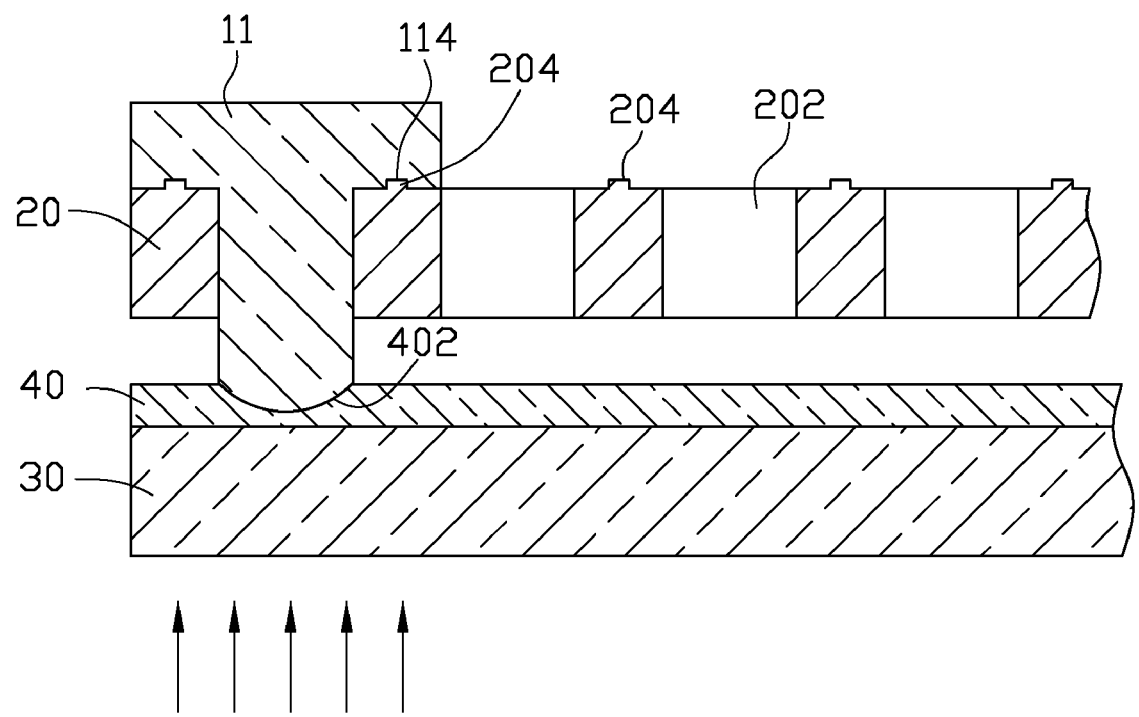
FIG. 7 shows that the to-be-solidified film is solidified by UV light.

Referring to FIG. 7, from the side of the second surface 304 of the transparent substrate 30, UV light is applied to solidify a pressed portion of the to-be-solidified film 40.

Figure 8:
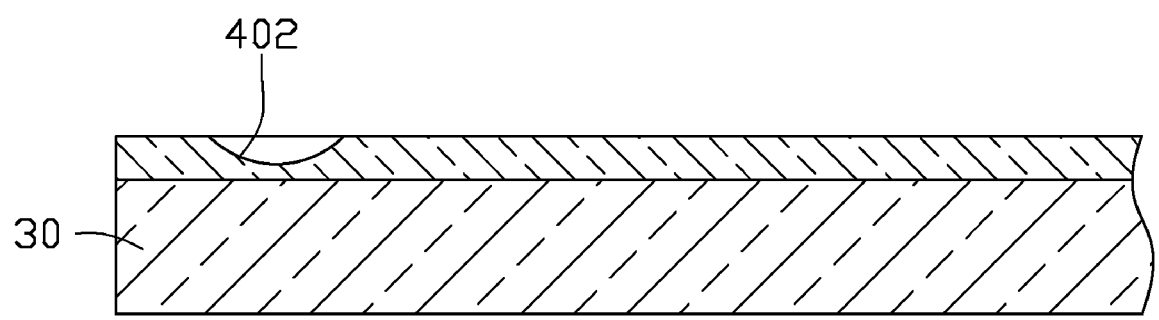
FIG. 8 shows that a second molding surface is formed on the to-be-solidified film.

Referring to FIG. 8, removing the stamper 10, thus a second molding surface 402 on the to-be-solidified film 40 is obtained. The second molding surface 402 matches the first molding surface 141. The second molding surface 402 is a concave aspherical shape.

Figure 9:
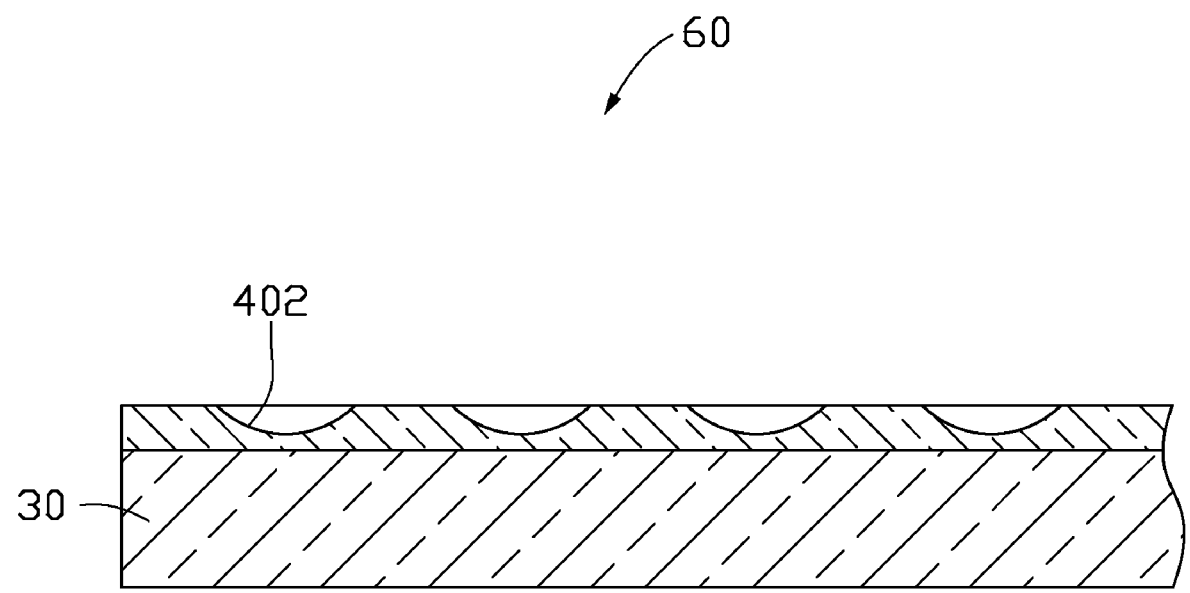
FIG. 9 is a schematic, cross-sectional view of a soft mold made by a method according to an exemplary embodiment of the present invention.

Referring to FIG. 9, repeating the steps from the molding portion 14 of the stamper 10 inserts one through hole 202 to UV light is applied to solidify a pressed portion of the to-be-solidified film 40. Thus, a soft mold 60 having a plurality of the second molding surfaces 402 is obtained. It is to be noted that, in the process of forming each of the second molding surfaces 402, the UV light should be controlled properly to avoid solidifying other regions of the to-be-solidified film 40 with no second molding surface 402 formed thereon yet.

With the aligning of the first alignment marks 114 and the second alignment marks 204 before imprinting, the stamper 10 will not tilt towards the to-be-solidified film 40, thus the dimension precision of the second molding surface 402 of the soft mold 60 is improved.

While certain embodiments have been described and exemplified above, various other embodiments from the foregoing disclosure will be apparent to those skilled in the art. The present invention is not limited to the particular embodiments described and exemplified but is capable of considerable variation and modification without departure from the scope and spirit of the appended claims.

The invention claimed is:

1. A method for making a soft mold, the method comprising:
   (1) forming a to-be-solidified film on a transparent substrate;
   (2) providing a guiding plate, the guiding plate comprising a plurality of through holes defined therein, and a plurality of second alignment marks adjacent to the respective through holes;
   (3) positioning the guiding plate between a stamper and the to-be-solidified film, the stamper comprising a base having a surface, and a first alignment mark formed on the surface;
   (4) inserting the stamper through one of the through holes of the guiding plate;
   (5) aligning the first alignment mark with one of the second alignment marks;
   (6) pressing the stamper into the to-be-solidified film;
   (7) solidifying a pressed portion of the to-be-solidified film to obtain a second molding surface on the to-be-solidified film; and
   (8) repeating the steps (4) through (7) to obtain a soft mold having a plurality of the second molding surfaces.

2. The method of claim 1, wherein the to-be-solidified film is formed by a process selected from the group consisting of a spin coating process and a slit coating.

3. The method of claim 1, wherein the to-be-solidified film is made of light-curable material.

4. The method of claim 3, wherein the light-curable material is selected from the group consisting of epoxy resin, acrylate-based resin, polyurethane, and polymerized siloxanes.

5. The method of claim 1, wherein the to-be-solidified film is solidified by UV light irradiation.

6. The method of claim 1, wherein the second alignment mark is a protrusion protruding from a surface of the guiding plate.

7. The method of claim 1, wherein the second alignment mark is a recess defined in a surface of the guiding plate.

8. The method of claim 1, wherein the second alignment mark is cross-shaped.

* * * * *